US009484868B2

(12) United States Patent
Onishi

(10) Patent No.: US 9,484,868 B2
(45) Date of Patent: Nov. 1, 2016

(54) DISTORTION COMPENSATION APPARATUS AND WIRELESS COMMUNICATION APPARATUS

(71) Applicant: SUMITOMO ELECTRIC INDUSTRIES, LTD., Osaka-shi, Osaka (JP)

(72) Inventor: Masahiko Onishi, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 14/890,940

(22) PCT Filed: Jun. 2, 2014

(86) PCT No.: PCT/JP2014/064636
§ 371 (c)(1),
(2) Date: Nov. 13, 2015

(87) PCT Pub. No.: WO2014/196504
PCT Pub. Date: Dec. 11, 2014

(65) Prior Publication Data
US 2016/0134248 A1    May 12, 2016

(30) Foreign Application Priority Data
Jun. 3, 2013   (JP) .................................. 2013-117263

(51) Int. Cl.
*H03F 1/26* (2006.01)
*H03F 1/32* (2006.01)
(Continued)

(52) U.S. Cl.
CPC .......... *H03F 1/3241* (2013.01); *H03F 1/3247* (2013.01); *H03F 3/19* (2013.01); *H03F 3/21* (2013.01); *H03F 3/24* (2013.01); *H03F 2200/451* (2013.01); *H03F 2201/3215* (2013.01)

(58) Field of Classification Search
CPC ........................................................ H03F 1/26
USPC ......................... 330/149; 375/297; 455/114.2
See application file for complete search history.

(56) References Cited

U.S. PATENT DOCUMENTS 7,058,369 B1 * 6/2006 Wright ................... H01Q 1/243
375/297
7,542,519 B2 * 6/2009 McCallister ......... H04B 1/0075
330/149
(Continued)

FOREIGN PATENT DOCUMENTS

EP    1 612 933 A1    1/2006
JP    2003-124752 A    4/2003
(Continued)

OTHER PUBLICATIONS

Youngcheol Park, et al., "Adaptive Predistortion Linearization of RF Power Amplifiers Using Lookup Tables Generated from Subsampled Data," IEEE 2002, pp. 233-236.

*Primary Examiner* — Patricia T Nguyen
(74) *Attorney, Agent, or Firm* — Drinker Biddle & Reath LLP

(57) ABSTRACT

Distortion is effectively reduced in a wide frequency band of an output signal from an amplifier. A distortion compensation apparatus includes: a distortion compensation processing section that performs a distortion compensation process on an input signal to the amplifier, based on a first amplifier model of the amplifier, and output a compensated signal; a signal generation section that receives the compensated signal and a first digital monitor signal, and generates a second digital monitor signal; and an estimation section that estimates the first amplifier model, based on the compensated signal and the second digital monitor signal. The first digital monitor signal is a signal generated by subjecting an analog monitor signal obtained by monitoring an output signal from the amplifier, to analog-to-digital conversion. A monitor band of the first digital monitor signal is narrower than a frequency band of the compensated signal. A frequency band of the second digital monitor signal is wider than the monitor band of the first digital monitor signal, and includes signal components obtained by restoring signal components outside the monitor band, among signal components included in the analog monitor signal. The signal generation section restores the signal components outside the monitor band among the signal components included in the analog monitor signal, based on the compensated signal and the first digital monitor signal.

10 Claims, 7 Drawing Sheets

(51) Int. Cl.
*H03F 3/24* (2006.01)
*H03F 3/19* (2006.01)
*H03F 3/21* (2006.01)

(56) References Cited

U.S. PATENT DOCUMENTS

| | | | |
|---|---|---|---|
| 8,023,588 B1* | 9/2011 | Benson | H04L 25/03343 330/147 |
| 8,699,620 B1* | 4/2014 | Wu | H04N 7/52 375/254 |
| 2003/0031270 A1 | 2/2003 | Giardina et al. | |
| 2005/0195919 A1* | 9/2005 | Cova | H03F 1/3258 375/297 |
| 2008/0187035 A1 | 8/2008 | Nakamura et al. | |
| 2011/0156815 A1* | 6/2011 | Kim | H03F 1/304 330/149 |

FOREIGN PATENT DOCUMENTS

| | | |
|---|---|---|
| JP | 2004-312344 A | 11/2004 |
| JP | 2010-157936 A | 7/2010 |
| JP | 4909261 B2 | 4/2012 |
| WO | WO-2005/094537 A2 | 10/2005 |
| WO | WO-2007/046370 A1 | 4/2007 |

* cited by examiner

DISTORTION COMPENSATION APPARATUS AND WIRELESS COMMUNICATION APPARATUS

TECHNICAL FIELD

The present invention relates to a distortion compensation apparatus and a wireless communication apparatus.

BACKGROUND ART

When power is amplified with an amplifier such as a high power amplifier (hereinafter referred to as "HPA") or the like, desired input-output characteristics may not be obtained due to nonlinear distortion characteristics of the amplifier.

In particular, when the frequency of a radio signal to be amplified is high, it is necessary to perform predistortion for canceling the nonlinear distortion characteristics by using digital signal processing.

For example, Patent Literature 1 discloses a distortion compensation circuit that performs predistortion by using a monitor signal obtained by monitoring an output signal from an amplifier. In Patent Literature 1, the distortion compensation circuit performs the predistortion by using a digital monitor signal. However, the monitor signal obtained by monitoring the output signal from the amplifier is an analog signal (analog monitor signal). In order to generate a digital monitor signal, an analog-to-digital converter (AD converter) performs analog-to-digital conversion on the analog monitor signal.

CITATION LIST

Patent Literature

PATENT LITERATURE 1: Japanese Laid-Open Patent Publication No. 2010-157936

SUMMARY OF INVENTION

Technical Problem

Generally, a distortion compensation circuit is required to perform distortion compensation over a frequency band about five times a frequency band (hereinafter referred to as "use band") used by a radio signal. Thereby, distortion of an output signal from an amplifier can be sufficiently reduced.

In the distortion compensation circuit disclosed in Patent Literature 1, by increasing the sampling frequency of the AD converter, the frequency band of the digital monitor signal can be set to about five times the use band of the radio signal.

However, such an increase in the sampling frequency of the AD converter usually causes an increase in the cost of the AD converter. For example, assuming that the use band of the radio signal to be transmitted is 20 MHz, the sampling frequency required of the AD converter is 100 MHz or more. As a result, a relatively expensive AD converter is needed.

Therefore, it is desired to realize a distortion compensation apparatus capable of effectively reducing distortion over a wide band (a band wider than the band of the digital monitor signal) of the output signal from the amplifier, while using an AD converter having a relatively low sampling frequency.

Therefore, an object of the present invention is to provide a novel technique for effectively reducing distortion over a wide frequency band of an output signal from an amplifier.

Solution to Problem

An aspect of the present invention is a distortion compensation apparatus that compensates for distortion of an amplifier. The distortion compensation apparatus includes: a distortion compensation processing section that performs a distortion compensation process on an input signal to the amplifier, based on a first amplifier model of the amplifier, and outputs a compensated signal; a signal generation section that receives the compensated signal and a first digital monitor signal, and generates a second digital monitor signal; and an estimation section that estimates the first amplifier model, based on the compensated signal and the second digital monitor signal.

The first digital monitor signal is a signal generated by subjecting an analog monitor signal obtained by monitoring an output signal from the amplifier, to analog-to-digital conversion.

A monitor band of the first digital monitor signal is narrower than a frequency band of the compensated signal.

A frequency band of the second digital monitor signal is wider than the monitor band of the first digital monitor signal, and includes signal components obtained by restoring signal components outside the monitor band, among signal components included in the analog monitor signal.

The signal generation section restores the signal components outside the monitor band among the signal components included in the analog monitor signal, based on the compensated signal and the first digital monitor signal.

Another aspect of the present invention is a wireless communication apparatus including the distortion compensation apparatus.

Advantageous Effects of Invention

According to the present invention, it is possible to effectively reduce distortion over a wide frequency band of an output signal from an amplifier.

DESCRIPTION OF EMBODIMENTS

[1. Summary of Embodiments]

Figure 1:
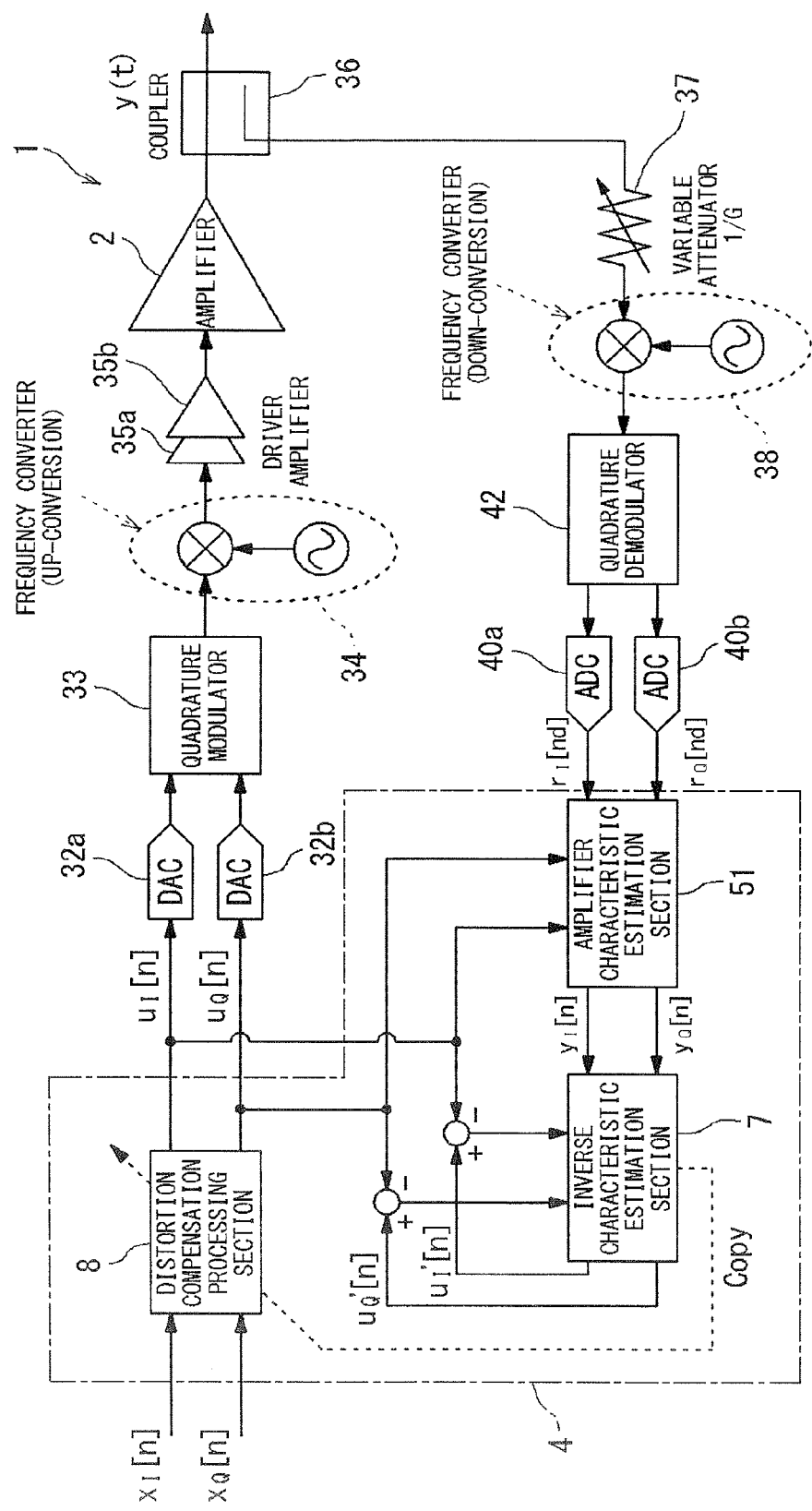
FIG. 1 is a circuit diagram of an amplifier circuit according to a first embodiment.

(1) A distortion compensation apparatus according to an embodiment compensates for distortion of an amplifier. The distortion compensation apparatus includes: a distortion compensation processing section that performs a distortion compensation process on an input signal to the amplifier, based on a first amplifier model of the amplifier, and outputs a compensated signal; a signal generation section that receives the compensated signal and a first digital monitor signal, and generates a second digital monitor signal; and an estimation section that estimates the first amplifier model, based on the compensated signal and the second digital monitor signal.

The first digital monitor signal is a signal generated by subjecting an analog monitor signal obtained by monitoring an output signal from the amplifier, to analog-to-digital conversion.

A monitor band of the first digital monitor signal is narrower than a frequency band of the compensated signal.

A frequency band of the second digital monitor signal is wider than the monitor band of the first digital monitor signal, and includes signal components obtained by restoring signal components outside the monitor band, among signal components included in the analog monitor signal.

The signal generation section restores the signal components outside the monitor band among the signal components included in the analog monitor signal, based on the compensated signal and the first digital monitor signal.

The monitor band of the first digital monitor signal may be a band narrower than the band of the compensated signal (e.g., a band as narrow as the band of the input signal before subjected to distortion compensation). Therefore, the sampling frequency used for analog-to-digital conversion of analog monitor signal can be reduced.

However, when the monitor band of the first digital monitor signal becomes narrower than the band of the compensated signal, the signal components (distortion components) outside the monitor band, among the signal components included in the analog monitor signal, are lost.

In this configuration, however, the signal generation section can restore the signal components outside the monitor band, among the signal components included in the analog monitor signal.

Therefore, the estimation section is allowed to estimate the first amplifier model based on the second digital monitor signal having a frequency band wider than that of the first digital monitor signal.

(2) Preferably, the estimation section generates a replica signal of the compensated signal based on the second digital monitor signal, and estimates the first amplifier model based on an error signal indicating an error of the replica signal with respect to the compensated signal.

According to this configuration, in the first amplifier model, amplification characteristic of the amplifier in the frequency band of the second digital monitor signal is faithfully reproduced.

(3) Preferably, the signal generation section estimates a second amplifier model of the amplifier based on the compensated signal and the first digital monitor signal, and performs a distortion adding process on the compensated signal by using the estimated second amplifier model to generate the second digital monitor signal.

According to this configuration, the second digital monitor signal having a frequency band wider than monitor band of the first digital monitor signal can be generated by using the second amplifier model.

(4) Preferably, the signal generation section generates a first replica signal of the compensated signal based on the compensated signal and the first digital monitor signal, generates a second replica signal by performing decimation to make a frequency band of the first replica signal correspond to the monitor band, and estimates the second amplifier model based on an error signal indicating an error of the first digital monitor signal with respect to the second replica signal.

Signal components in bands outside the monitor band, which are included in the analog monitor signal, exist as aliasing in the first digital monitor signal. The second replica signal is generated by performing decimation to make the frequency band of the first replica signal correspond to the monitor band. Therefore, the signal components in the bands outside the monitor band also exist as aliasing in the second replica signal.

Since the second amplifier model is estimated based on the error signal indicating the error between the second replica signal and the first digital monitor signal, both including the aliasing, contribution of the aliasing is reflected in the second amplifier model. That is, contribution of the signal components in the bands outside the monitor band is reflected in the second amplifier model. Therefore, in the second digital monitor signal, the output signal of the amplifier is faithfully reproduced up to the signal components in the bands outside the monitor band.

(5) Preferably, the distortion compensation apparatus further includes an ACLR calculator that calculates an ACLR, based on the second digital monitor signal generated by the signal generation section.

According to this configuration, the ACLR of the output signal from the amplifier is calculated by using a distortion-added signal in which signal components included in a band wider than the monitor band are reflected. Therefore, the ACLR can be calculated more accurately as compared to the configuration of calculating the ACLR of the output signal from the amplifier by using the first digital monitor signal.

(6) Preferably, the distortion compensation apparatus further includes: a sequence characteristic estimation section that estimates a sequence model of an amplification sequence including the amplifier and the distortion compensation processing section, based on an input signal to the distortion compensation processing section and on the first digital monitor signal, performs a distortion adding process on the input signal, based on the estimated sequence model, and outputs a distortion-added signal; and an ACLR calculator that calculates an ACLR by using the distortion-added signal output from the sequence characteristic estimation section.

According to this configuration, the ACLR of the output signal from the amplifier is calculated by using a distortion-added signal in which signal components included in a band wider than the monitor band are reflected. Therefore, the ACLR can be calculated more accurately as compared to the configuration of calculating the ACLR of the output signal from the amplifier by using the first digital monitor signal.

(7) Preferably, the sequence characteristic estimation section generates a replica signal of an output signal from the amplification sequence, based on the input signal, and estimates the sequence model, based on an error signal indicating an error of the replica signal with respect to the first digital monitor signal.

According to this configuration, the sequence model can be calculated from the input signal.

(8) Preferably, the amplifier has a power efficiency of 30% or more. In the high-efficiency amplifier having the power efficiency of 30% or more, large distortion is likely to occur, and the frequency band of the compensated signal is likely to increase. Therefore, it is particularly useful to apply the above technique.

(9) Preferably, the input signal has a frequency band of 20 MHz or more. When the frequency band of the signal is 20 MHz or more, the distortion compensation process is highly needed. Therefore, it is particularly useful to apply the above technique.

(10) A wireless communication apparatus according to an embodiment includes the distortion compensation apparatus according to any one of above (1) to (9).

[Details of Embodiments]

Hereinafter, preferred embodiments of the present invention will be described with reference to the drawings.

[2. First Embodiment]

<1> Configuration

FIG. 1 shows a configuration of an amplifier circuit 1 according to the present embodiment.

The amplifier circuit 1 is included in a wireless communication apparatus installed in a wireless base station, and is used for amplification of signals to be transmitted and received.

The amplifier circuit 1 includes a high-power amplifier 2, and a distortion compensation apparatus 4.

The amplifier 2 amplifies an input signal. The amplifier 2 is a high-efficiency amplifier having, for example, a power efficiency of 30% or more, and more preferably, a power efficiency of 40% or more. The higher the efficiency of the amplifier 2 is, the more the amplifier 2 causes distortion. Therefore, the frequency band of a compensated signal output from the distortion compensation apparatus 4 needs to be wide.

The distortion compensation apparatus 4 performs distortion compensation by digital signal processing. The distortion compensation apparatus 4 is composed of a wired logic circuit. The distortion compensation apparatus 4 may be composed of a computer including a memory (not shown) and a processor (not shown).

The distortion compensation apparatus 4 includes an inverse characteristic estimation section (hereinafter, referred to as "estimation section") 7, a distortion compensation processing section 8, and an amplifier characteristic estimation section (signal generation section) 51. If the distortion compensation apparatus 4 is a computer, each of these components may be implemented by a processor executing a predetermined program stored in a memory.

The estimation section 7 estimates a model (first amplifier model, hereinafter referred to as "inverse model") of a virtual amplifier which represents an amplification characteristic inverse to the amplification characteristic of the amplifier 2. Then, the estimation section 7 copies the estimated inverse model (specifically, a parameter representing the inverse model) into the distortion compensation processing section 8. This operation of the estimation section 7 will be described later in detail.

The distortion compensation processing section 8 performs a predistortion process on an input signal by using the inverse model copied from the estimation section 7. Then, the distortion compensation processing section 8 outputs a signal (hereinafter referred to as "compensated signal") generated by the predistortion process. The input signal and the compensated signal are digital signals. The frequency band of the input signal is set to 20 MHz or more. The frequency band of the compensated signal is set to 100 MHz, for example.

The amplifier characteristic estimation section 51 estimates an amplifier model (second amplifier model, hereinafter referred to as "forward model") representing the same amplification characteristic as that of the amplifier 2. Then, the amplifier characteristic estimation section 51 performs a distortion adding process on the compensated signal by using the estimated forward model (specifically, a parameter representing the forward model). Thereby, the amplifier characteristic estimation section 51 generates a digital monitor signal (second digital monitor signal) in which signal components outside a monitor band described later, among signal components included in the analog monitor signal, are restored, and outputs the digital monitor signal. Hereinafter, this digital monitor signal is referred to as a "restored signal". The frequency band of the restored signal is set to be the same as that of the compensated signal. The operation of the amplifier characteristic estimation section 51 will be described later in detail.

The amplifier circuit 1 further includes DACs (DA converters) 32a, 32b, a quadrature modulator 33, frequency converters 34, 38, driver amplifiers 35a, 35b, a coupler 36, a variable attenuator 37, a quadrature demodulator 42, and ADCs (AD converters) 40a, 40b.

The DAC 32a, 32b converts an input digital signal into an analog signal. The DAC 32a, 32b performs digital-to-analog conversion on a compensated signal $u_I[n]$, $u_Q[n]$ input from the distortion compensation apparatus 4, and outputs a resultant signal. The sampling frequency of the DAC 32a, 32b is set to be equal to or higher than the sampling frequency of the compensated signal.

The quadrature modulator 33 performs quadrature modulation on the compensated signal (analog I and Q baseband signal) that has been converted into an analog signal by the DAC 32a, 32b.

The frequency converter 34 performs frequency up-conversion on the signal that has been quadrature-modulated by the quadrature modulator 33.

The driver amplifier 35a, 35b amplifies the signal that has been subjected to the frequency up-conversion by the frequency converter 34, and inputs a resultant signal to the amplifier 2.

The coupler 36 outputs an analog monitor signal obtained by monitoring an output signal y(t) from the amplifier 2.

The frequency converter 38 performs frequency down-conversion on the analog monitor signal input from the coupler 36 via the variable attenuator (1/G) 37.

The quadrature demodulator 42 performs quadrature demodulation on the analog monitor signal output from the frequency converter 38.

The ADC 40a, 40b performs analog-to-digital conversion on the analog monitor signal input from the quadrature demodulator 42 to generate a digital monitor signal (first digital monitor signal). Then, the ADC 40a, 40b inputs the generated digital monitor signal to the amplifier characteristic estimation section 51. The sampling frequency of the ADC 40a, 40b is set to be the same as that of the input signal. For example, when the frequency band of the input signal is 20 MHz, the sampling frequency is set to 20 MHz. That is, the sampling frequency of the ADC 40a, 40b is obtained by performing analog-to-digital conversion with a sampling frequency lower than the sampling frequency (100 MHz) of the compensated signal. The frequency band of the digital monitor signal is set to 20 MHz, for example. Hereinafter, the frequency band of the digital monitor signal is referred to as a "monitor band". The monitor band is not limited to 20 MHz, and may be narrower than 20 MHz.

By the way, the narrower the monitor band is, the lower the sampling frequency (monitor speed) of the ADC 40 (40a, 40b) can be. The lower the sampling frequency of the ADC 40 (40a, 40b) is, the lower the cost of the ADC 40 is. Moreover, in the present embodiment, the restored signal having the same frequency band as that of the compensated signal is generated from the digital monitor signal in the monitor band, and the amplifier characteristic is estimated by using the generated restored signal. Therefore, reduction in accuracy of estimation of the amplifier characteristic can be suppressed even when the monitor band is narrow.

That is, in the present embodiment, reduction in the amplifier characteristic estimation accuracy is suppressed, and possibility of selecting inexpensive ADCs is increased.

By the way, aliasing exists in the digital monitor signal output from the ADC 40a, 40b. The aliasing is caused by that signal components, among signal components of the analog monitor signal, which are included in bands outside the monitor band of the digital monitor signal, are folded back into the monitor band. It is assumed that the monitor band of the digital monitor signal output from the ADC 40a, 40b is set to 20 MHz, for example. In this case, signal components in bands outside the band of 20 MHz, among the signal components of the analog monitor signal, exist as aliasing in the digital monitor signal.

<2> Operation of Estimation Section

First, correspondence between various signals and reference numerals shown in FIG. 1, which are required for description of operation, will be described.

*[n] (n: positive integer, *: $x_I$, $u_I$, $y_I$, or the like) represents a digital signal sampled at time n×T when the sampling interval is T [sec]. *[nd] (nd: positive integer) represents a digital signal sampled at time nd×Td when the sampling interval is Td (>T) [sec]. *(t) represents an analog signal sampled at time t [sec].

$x_I[n]$, $x_Q[n]$ represent an input signal to the distortion compensation processing section 8. Specifically, $x_I[n]$ represents a real part (I-channel) of the input signal, and $x_Q[n]$ represents an imaginary part (Q-channel) of the input signal. That is, the input signal is represented in a form of $x_I[n]+i\times x_Q[n]$ (i: imaginary number).

$u_I[n]$, $u_Q[n]$ represent a compensated signal output from the distortion compensation processing section 8. Specifically, $u_I[n]$ represents a real part (I-channel) of the compensated signal, and $u_Q[n]$ represents an imaginary part (Q-channel) of the compensated signal. That is, the compensated signal is represented in a form of $u_I[n]+i\times u_Q[n]$ (i: imaginary number).

$u_I'[n]$, $u_Q'[n]$ represent a replica signal used for inverse characteristic estimation. $u_I'[n]$ represents a real part (I-channel) of the replica signal, and $u_Q'[n]$ represents an imaginary part (Q-channel) of the replica signal. That is, the replica signal is represented in a form of $u_I'[n]+i\times u_Q'[n]$ (i: imaginary number).

$y_I[n]$, $y_Q[n]$ represent a restored signal y(t) output from the amplifier characteristic estimation section 51. $y_I[n]$ represents a real part (I-channel) of the restored signal, and $y_Q[n]$ represents an imaginary part (Q-channel) of the restored signal. That is, a distortion-added signal is represented in a form of $y_I[n]+i\times y_Q[n]$ (i: imaginary number).

$r_I[nd]$, $r_Q[nd]$ represent a digital monitor signal input from the ADCs 40a, 40b. $r_I[nd]$ represents a real part (I-channel) of the digital monitor signal, and $r_Q[nd]$ represents an imaginary part (Q-channel) of the digital monitor signal. That is, the digital monitor signal is represented in a form of $r_I[nd]+i\times r_Q[nd]$ (i: imaginary number).

Next, the operation of the estimation section 7 will be described.

The estimation section 7 obtains an inverse model of the amplifier 2, based on the compensated signal $u_I[n]$, $u_Q[n]$ output from the distortion compensation processing section 8 and the restored signal $y_I[n]$, $y_Q[n]$ input from the amplifier characteristic estimation section 51. Then, the estimation section 7 copies a parameter representing the obtained inverse model into the distortion compensation processing section 8.

First, the estimation section 7 sets the parameter representing the inverse model to an initial value.

Next, the estimation section 7 performs a distortion compensation process on the restored signal $y_I[n]$, $y_Q[n]$ by using the inverse model in which the parameter is set to the initial value. Thereby, the estimation section 7 generates a replica signal $u_I'[n]$, $u_Q'[n]$ of the compensated signal $u_I[n]$, $u_Q[n]$.

Subsequently, the estimation section 7 acquires an error signal ($u_I'[n]-u_I[n]$, $u_Q'[n]-u_Q[n]$) representing an error between the compensated signal $u_I[n]$, $u_Q[n]$ output from the distortion compensation processing section 8 and the generated replica signal $u_I'[n]$, $u_Q'[n]$.

Thereafter, the estimation section 7 determines whether or not an absolute value of the error signal is smaller than a predetermined reference value. Upon determining that the absolute value of the error signal is equal to or larger than the reference value, the estimation section 7 updates the parameter of the inverse model, and again performs the distortion compensation process to generate a replica signal $u_I'[n]$, $u_Q'[n]$.

Next, the estimation section 7 again acquires an error signal between the compensated signal $u_I[n]$, $u_Q[n]$ and the replica signal $u_I'[n]$, $u_Q'[n]$, and compares an absolute value of the error signal to the reference value.

Thereafter, the estimation section 7 repeats updating of the parameter of the inverse model, generation of a replica signal $u_I'[n]$, $u_Q'[n]$, acquisition of an error signal, and comparison of the absolute value of the error signal with the reference value, until the absolute value of the error signal converges to a value smaller than the predetermined reference value.

Consequently, the estimation section 7 generates the replica signal $u_I'[n]$, $u_Q'[n]$ of the compensated signal $u_I[n]$, $u_Q[n]$, based on the restored signal $y_I[n]$, $y_Q[n]$. Then, the estimation section 7 estimates the inverse model, based on the error signal of the replica signal $u_I'[n]$, $u_Q'[n]$ with respect to the compensated signal $u_I[n]$, $u_Q[n]$.

Then, the estimation section 7 copies the parameter representing the estimated inverse model into the distortion compensation processing section 8.

<3> Detailed Configuration and Operation of Amplifier Characteristic Estimation Section Next, the configuration and operation of the amplifier characteristic estimation section 51 will be described in detail.

The compensated signal $u_I[n]$, $u_Q[n]$ output from the distortion compensation processing section 8 and the digital monitor signal (first digital monitor signal) $r_I[nd]$, $r_Q[nd]$ are input to the amplifier characteristic estimation section 51.

The amplifier characteristic estimation section 51 estimates the amplifier model (forward model), based on the compensated signal $u_I[n]$, $u_Q[n]$ output from the distortion compensation processing section 8 and the digital monitor signal $r_I[nd]$, $r_Q[nd]$. Then, the amplifier characteristic estimation section 51 performs a distortion adding process on the compensated signal $u_I[n]$, $u_Q[n]$ by using the estimated forward model to generate the restored signal (second digital monitor signal) $y_I[n]$, $y_Q[n]$. The restored signal $y_I[n]$, $y_Q[n]$ is a restored signal of the output signal from the amplifier 2. That is, the amplifier characteristic estimation section 51 restores the analog monitor signal, based on the compensated signal $u_I[n]$, $u_Q[n]$ and the first digital monitor signal $r_I[nd]$, $r_Q[nd]$.

The amplifier characteristic estimation section 51 inputs the generated restored signal $y_I[n]$, $y_Q[n]$ to the estimation section 7.

Figure 2A:
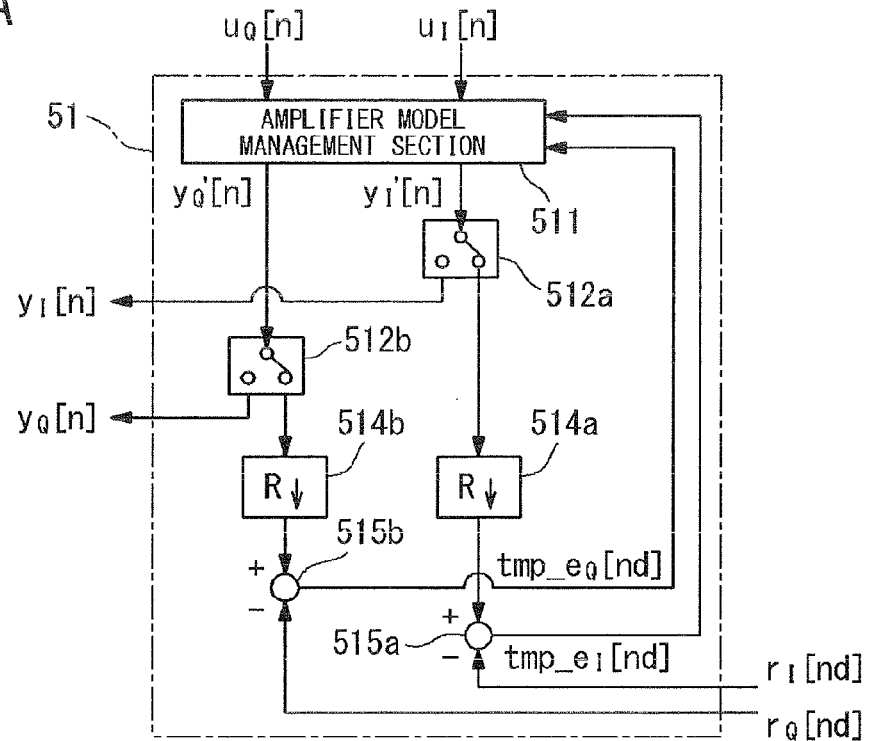
FIG. 2A shows an amplifier characteristic estimation section according to the first embodiment shows a configuration thereof before a forward model is established.
Figure 2B:
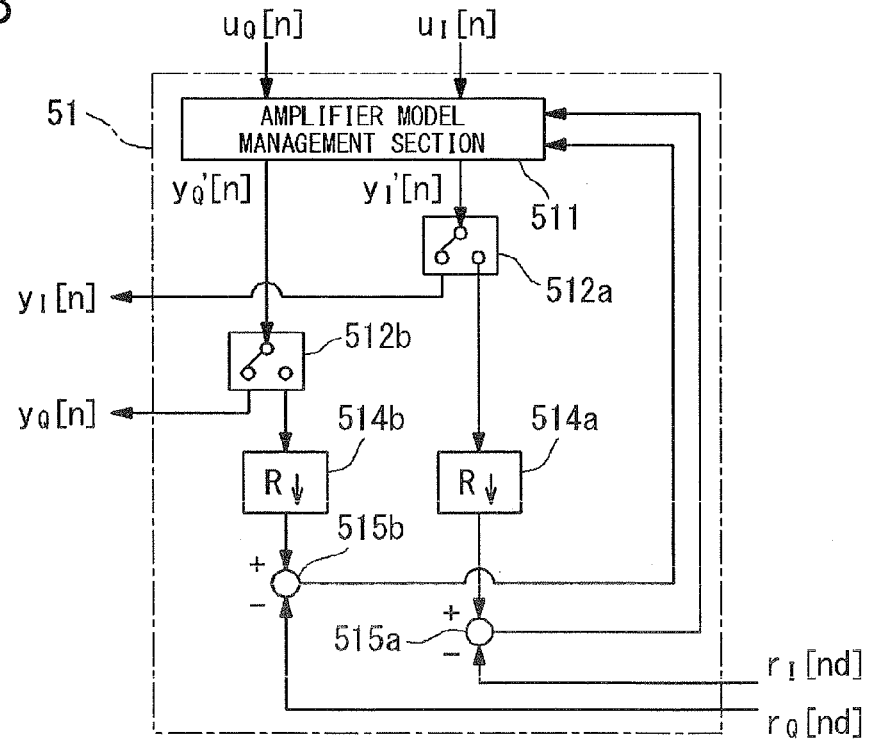
FIG. 2B shows an amplifier characteristic estimation section according to the first embodiment and shows a configuration thereof after the forward model is established.

FIG. 2A shows the configuration of the amplifier characteristic estimation section 51 and shows the state before an amplifier model is established. FIG. 2B shows the state after the amplifier model is established.

The amplifier characteristic estimation section 51 includes an amplifier model management section 511, two selectors 512a, 512b, two decimation filters 514a, 514b, and differential units 515a, 515b.

The amplifier model management section 511 manages the forward model of the amplifier 2. The term "manage" means retention of the forward model, updating of the forward model, and the like. The amplifier model management section 511 generates a replica signal (first replica signal) $y_I'[n]$, $y_Q'[n]$ of the restored signal $y_I[n]$, $y_Q[n]$, based on the forward model and the compensated signal $u_I[n]$, $u_Q[n]$, and outputs the replica signal. The forward model is expressed by a relational expression established between the compensated signal $u_I[n]$, $u_Q[n]$ and the replica signal $y_I'[n]$, $y_Q'[n]$. The relational expression is expressed as the following equation (1) if a memory effect that occurs inside the amplifier 2 is considered.

[Formula 1]
$$y'[n] = \sum_{l=-L_1}^{L_2} \sum_{m=-M_1}^{M_2} \sum_{k=1}^{K'_{m,l}} g_{k,l,m} \cdot |u[n-l-m]|^{k-1} \cdot u[n-l] \quad (1)$$

where $y'[n](=y_I'[n]+iy_Q'[n])$ indicates the replica signal, and $u[n](=u_I'[n]+iu_Q'[n])$ indicates the compensated signal.

l, m are parameters indicating a time difference with respect to a time corresponding to the replica signal $y'[n]$.

$g_{k,l,m}(k=0, 1, 2, \ldots, K'_{l,m})$ indicates a coefficient parameter representing the forward model. The coefficient parameter depends on the values of l and m. A coefficient parameter $g_{k,l,m}(k=0, 1, 2, \ldots, K'_{l,m})$ in which at least one of l and m is not 0 reflects the degree of contribution of the above-mentioned memory effect.

The selector 512a, 512b sets a transmission path for the replica signal $y_I'[n]$, $y_Q'[n]$ output from the amplifier model management section 511. Specifically, the selector 512a, 512b sets the transmission path to either a path extending from the amplifier model management section 511 to the decimation filter 514a, 514b or a path extending from the amplifier model management section 511 to the outside of the amplifier characteristic estimation section 51.

The decimation filter 514a, 514b subjects the replica signal $y_I'[n]$, $y_Q'[n]$ to decimation corresponding to the digital monitor signal $r_I[nd]$, $r_Q[nd]$ input from the ADC 40a, 40b, thereby generating a replica signal (second replica signal).

In the replica signal generated by the decimation filter 514a, 514b, signal components included in bands outside the band of the digital monitor signal $r_I[nd]$, $r_Q[nd]$, which signal components are included in the original replica signal $y_I'[n]$, $y_Q'[n]$, exist as aliasing. It is assumed that the band of the digital monitor signal $r_I[nd]$, $r_Q[nd]$ is set to 20 MHz, for example. In this case, in the extracted replica signal, information in bands outside the band of 20 MHz, which information is included in the original replica signal $y_I'[n]$, $y_Q'[n]$, exists as aliasing.

The differential unit 515a, 515b calculates an error signal corresponding to an error between the replica signal generated by the decimation filter 514a, 514b and the digital monitor signal $r_I[nd]$, $r_Q[nd]$.

Next, the operation of the amplifier characteristic estimation section 51 will be described.

Figure 3:
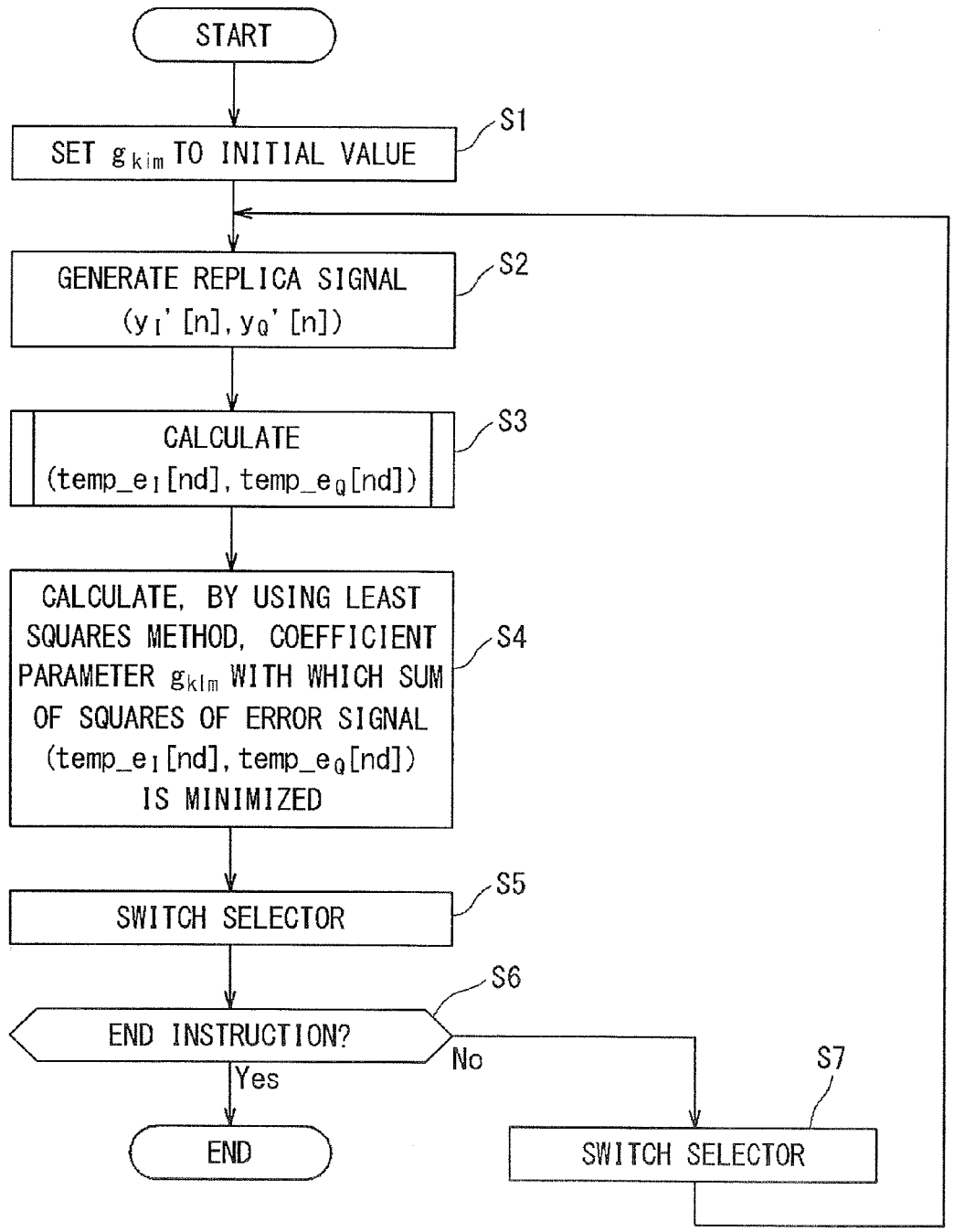
FIG. 3 is an operation flowchart of the amplifier characteristic estimation section according to the first embodiment.

FIG. 3 shows an operation flowchart of the amplifier estimation section 51. It is assumed that the forward model is expressed by the relational expression of the above equation (1).

<Overall operation>

First, the amplifier model management section 511 sets the coefficient parameter $g_{k,l,m}$ in the equation (1) to an initial value (step S1). The selector 512a, 512b sets the transmission path of the replica signal $y_I'[n]$, $y_Q'[n]$ to the path extending from the amplifier model management section 511 to the decimation filter 514a, 514b.

Next, the amplifier model management section 511 generates the replica signal $y_I'[n]$, $y_Q'[n]$ from the compensated signal $u_I[n]$, $u_Q[n]$ by using the equation (1) (step S2).

Subsequently, the amplifier model management section 511, the decimation filter 514a, 514b, and the differential unit 515a, 515b calculate an error signal (temp_$e_I[nd]$, temp_$e_Q[nd]$) in cooperation with each other (step S3). The process of calculating the error signal (temp_$e_I[nd]$, temp_$e_Q[nd]$) will be described later in detail.

Thereafter, the amplifier model management section 511 calculates, by using the least squares method, a coefficient parameter $g_{k,l,m}(k=0, 1, 2, \ldots, K'_{l,m})$ with which the sum of squares of the error signal (temp_$e_I[nd]$, temp_$e_Q[nd]$) is minimized (step S4).

Next, the selector 512a, 512b switches the transmission path of the replica signal $y_I'[n]$, $y_Q'[n]$ to the path extending from the amplifier model management section 511 to the outside of the amplifier characteristic estimation section 51 (step S5). At this time, the replica signal $y_I'[n]$, $y_Q'[n]$ output from the amplifier model management section 511 to the outside of the amplifier characteristic estimation section 51 corresponds to the restored signal $y_I[n]$, $y_Q[n]$.

As described above, after the forward model has been established, the amplifier model management section 511 performs the process of generating the restored signal $y_I[n]$, $y_Q[n]$ from the compensated signal $u_I[n]$, $u_Q[n]$ by using the equation (1). In this process, the amplifier model management section 511 also restores the signal components outside the monitor band. This process is equivalent to a process of generating the restored signal $y_I[n]$, $y_Q[n]$ by adding the restored signal components outside the monitor band to the digital monitor signal $r_I[nd]$, $r_Q[nd]$. The "signal components outside the monitor band" means the signal components outside the monitor band of the digital monitor signal $r_I[nd]$, $r_Q[nd]$, among the signal components of the output signal y(t).

As described above, the frequency band of the restored signal $y_I[n]$, $y_Q[n]$ is set to the same frequency band as that of the compensated signal $u_I[n]$, $u_Q[n]$. Thereby, in the forward model estimated by the estimation section 7, the signal component in the entire band of the compensated signal $u_I[n]$, $u_Q[n]$ is reflected. Therefore, distortion can be reduced over the wide band of the output signal from the amplifier 2, as compared with the configuration in which distortion compensation is performed only in the band of the digital monitor signal $r_I[\text{nd}]$, $r_Q[\text{nd}]$.

Next, the amplifier model management section 511 determines whether or not there is an end instruction which instructs to end the forward model estimation (step S6). This "end instruction" is triggered by an event such as power-off of the distortion compensation apparatus 4, for example.

When it is determined in step S6 that there is no end instruction (step S7: NO), the selector 512a, 512b switches the transmission path of the replica signal $y_I'[n]$, $y_Q'[n]$ to the path extending from the amplifier model management section 511 to the decimation filter 514a, 514b (step S7). Then, the amplifier model management section 511 again performs the process in step S2.

<Process of calculating error signal (tmp_$e_I$[nd], tmp_$e_Q$[nd])>

Next, the process of calculating an error $e_I$, $e_Q$ by the amplifier model management section 511, the decimation filter 514a, 514b, and the differential unit 515a, 515b operating in cooperation with each other, will be described in detail.

Figure 4A:
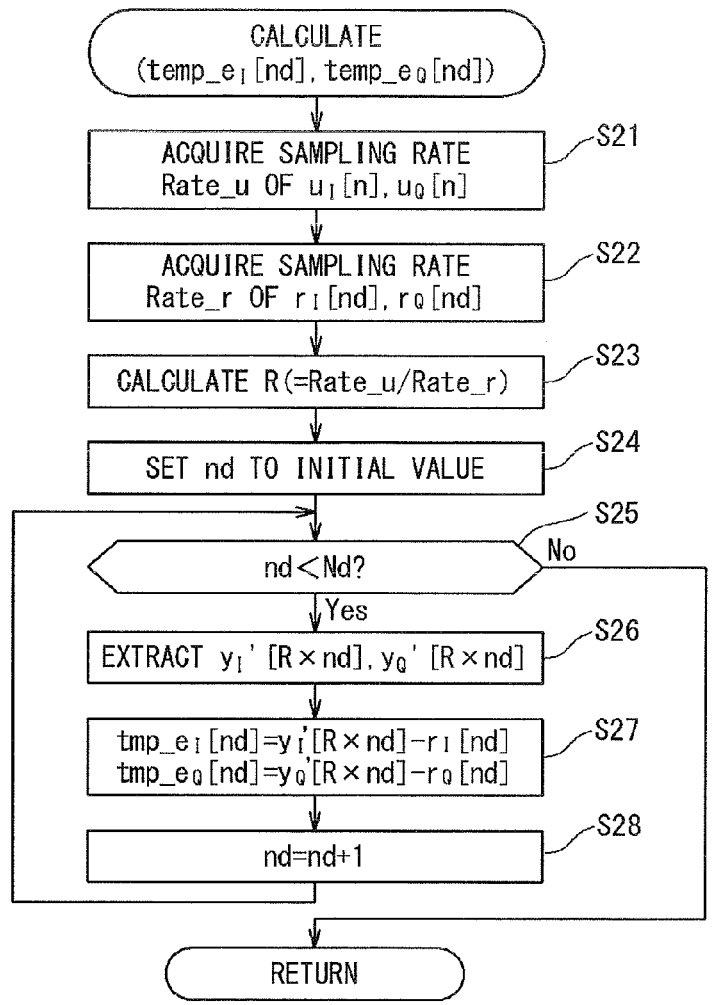
FIG. 4A is an operation flowchart of the amplifier characteristic estimation section according to the first embodiment.
Figure 4B:
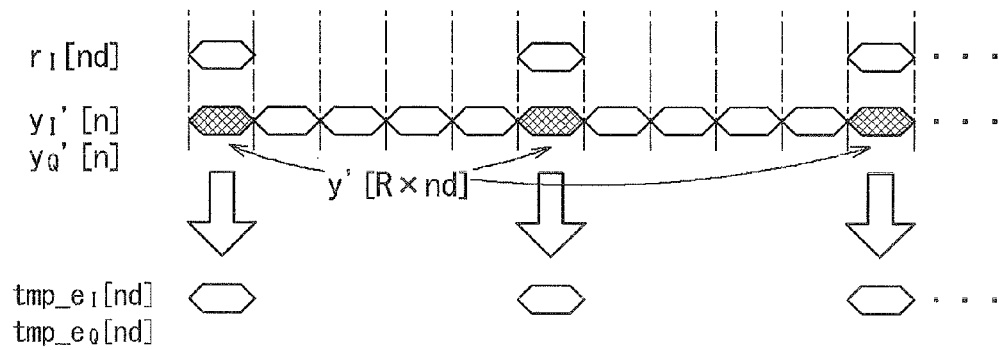
FIG. 4B shows a diagram illustrating an operation to calculate the errors $e_I$, $e_Q$.

FIG. 4A shows an operation flowchart of the amplifier estimation section 51, and FIG. 4B shows a diagram illustrating an operation to calculate the errors $e_I$, $e_Q$. FIG. 4A shows the operation flowchart in the process of calculating the errors $e_I$, $e_Q$.

First, the decimation filter 514a, 514b acquires a sampling rate Rate_u of the compensated signal $u_I[n]$, $u_Q[n]$ (step S21).

Next, the decimation filter 514a, 514b acquires a sampling rate Rate_r of the digital monitor signal $r_I[\text{nd}]$, $r_Q[\text{nd}]$ (step S22).

Subsequently, the decimation filter 514a, 514b calculates a ratio R(=Rate_u/Rate_r) of the sampling rate Rate_u to the sampling rate Rate_r (step S23).

Thereafter, the amplifier model management section 511 sets an index nd of data to be a target of calculation of the error signal (tmp_$e_I$[nd], tmp_$e_Q$[nd]), to an initial value (step S24).

Next, the amplifier model management section 511 determines whether or not the index nd is smaller than a predetermined reference value Nd (step S25).

It is assumed that, in step S25, the amplifier model management section 511 has determined that the index nd is smaller than the predetermined reference value Nd (step S25: YES).

In this case, the decimation filter 514a, 514b performs decimation on the replica signal $y_I'[n]$, $y_Q'[n]$ by using the calculated ratio R(=Rate_u/Rate_r). Then, the decimation filter 514a, 514b generates a replica signal (second replica signal) $y_I'[R \times \text{nd}]$, $y_Q'[R \times \text{nd}]$ (step S26).

For example, as shown in FIG. 4B, when the ratio R is 5, one replica signal $y_I'[R \times \text{nd}]$, $y_Q'[R \times \text{nd}]$ (R =5) corresponding to the digital monitor signal $r_I[\text{nd}]$, $r_I[\text{nd}]$, $r_Q[\text{nd}]$ appears in every five replica signals $y_i'[n]$, $y_Q'[n]$.

In this embodiment, by using the calculated ratio R (=5), the decimation filter 514a, 514b extracts the replica signals $y_I'[R \times \text{nd}]$, $y_Q'[R \times \text{nd}]$ (refer to hatched portions in FIG. 4B) from the replica signals $y_I'[n]$, $y_Q'[n]$.

Referring back to FIG. 4A, after step S26, the differential unit 515a, 515b generates the error signal (tmp_$e_I$[nd], tmp_$e_Q$[nd]) indicating an error between the replica signal $y_I'[R \times \text{nd}]$, $y_Q'[R \times \text{nd}]$ and the digital monitor signal $r_I[\text{nd}]$, $r_Q[\text{nd}]$ (step S27).

As described above, in the digital monitor signal $r_I[\text{nd}]$, $r_Q[\text{nd}]$, signal components in bands outside the band of the digital monitor signal $r_I[\text{nd}]$, $r_Q[\text{nd}]$, among the signal components included in the analog monitor signal, exist as aliasing.

Further, in the replica signal $y_I'[R \times \text{nd}]$, $y_Q'[R \times \text{nd}]$, signal components in bands outside the band of the digital monitor signal $r_I[\text{nd}]$, $r_Q[\text{nd}]$, among the signal components included in the replica signal $y_I'[n]$, $y_Q'[n]$, exist as aliasing.

Therefore, in the error signal (tmp_$e_I$[nd], tmp_$e_Q$[nd]), the aliasing existing in the digital monitor signal $r_I[\text{nd}]$, $r_Q[\text{nd}]$ and the aliasing existing in the replica signal $y_I'[R \times \text{nd}]$, $y_Q'[R \times \text{nd}]$ are reflected.

Thus, in the error signal (tmp_$e_I$[nd], tmp_$e_Q$[nd]), contribution of the signal components existing in the bands outside the band of the digital monitor signal $r_I[\text{nd}]$, $r_Q[\text{nd}]$, among the signal components included in the analog monitor signal and the replica signal $y_I'[n]$, $y_Q'[n]$, can be reflected.

Subsequently, the amplifier model management section 511 increments the index nd only by 1 (step S28), and again performs the process in step S25.

Further, in step S25, when it is determined that the index nd is equal to or larger than the predetermined reference value Nd (step S25: NO), the process of calculating the error signal (tmp_$e_I$[nd], tmp_$e_Q$[nd]) (nd=1, 2, . . . , Nd) is ended.

<4> Conclusion

Generally, in order to accurately compensate for distortion, as a sampling frequency for analog-to-digital conversion of the output signal y(t), a frequency band as wide as that of the compensated signal is required. That is, the sampling frequency of the digital monitor signal should be the same as the sampling frequency of the compensated signal. In this case, although a frequency band equivalent to the band of the compensated signal can be secured as the band of the digital monitor signal, the sampling frequency needs to be relatively high.

On the other hand, in the amplifier circuit 1 of the present embodiment, since the monitor band of the digital monitor signal $r_I[\text{nd}]$, $r_Q[\text{nd}]$ may be a band narrower than the band of the compensated signal $u_I[n]$, $u_Q[n]$ (e.g., a band as narrow as the band of the input signal $x_I[n]$, $x_Q[n]$ before subjected to distortion compensation), the sampling frequency of analog-to-digital conversion for generating the digital monitor signal $r_I[\text{nd}]$, $r_Q[\text{nd}]$ can be lowered.

However, when the monitor band of the digital monitor signal $r_I[\text{nd}]$, $r_Q[\text{nd}]$ becomes narrower than the band of the compensated signal $u_I[n]$, $u_Q[n]$, signal components (distortion components) outside the monitor band, among the signal components included in the output signal y(t), are lost.

However, in the amplifier circuit 1 of the present embodiment, the amplifier characteristic estimation section 51 restores the signal components in the bands outside the monitor band, among the signal components included in the output signal y(t), and generates the restored signal $y_I[n]$, $y_Q[n]$ equivalent to the digital monitor signal $r_I[\text{nd}]$, $r_Q[\text{nd}]$ to which the restored signal components are added.

Therefore, the estimation section 7 can estimate the inverse model, based on the restored signal $y_I[n]$, $y_Q[n]$ existing in a band wider than the band of the digital monitor signal $r_I[\text{nd}]$, $r_Q[\text{nd}]$.

Further, in the digital monitor signal $r_I[\text{nd}]$, $r_Q[\text{nd}]$, signal components in bands outside the band of the digital monitor signal $r_I[\text{nd}]$, $r_Q[\text{nd}]$, among the signal components included in the analog monitor signal, exist as aliasing. In addition, the replica signal $y_I'[R \times \text{nd}]$, $y_Q'[R \times \text{nd}]$ is generated by subjecting the replica signal $y_I'[n]$, $y_Q'[n]$ to decimation corresponding to the digital monitor signal $r_I[nd]$, $r_Q[nd]$. Thus, in the replica signal $y_I'[R \times nd]$, $y_Q'[R \times nd]$, signal components in bands outside the band of the digital monitor signal $r_I[nd]$, $r_Q[nd]$ exist as aliasing. Then, the forward model (second amplifier model) is estimated based on the error signal ($tmp\_e_I[nd]$, $tmp\_e_Q[nd]$) indicating an error between the replica signal $y_I'[R \times nd]$, $y_Q'[R \times nd]$ and the digital monitor signal $r_I[nd]$, $r_Q[nd]$, both having the aliasing. Thus, contribution of the aliasing is reflected in the forward model. That is, in the forward model, contribution of the signal components existing in a band wider than the band of the digital monitor signal $r_I[nd]$, $r_Q[nd]$ is reflected. Therefore, in the restored signal $y_I[n]$, $y_Q[n]$, the output signal y(t) of the amplifier 2 is faithfully reproduced up to a band wider than the band of the digital monitor signal $r_I[nd]$, $r_Q[nd]$.

Furthermore, the amplifier circuit 1 of the present embodiment utilizes aliasing included in the monitor signal. Therefore, for example, filters for removing the aliasing need not be provided between the quadrature demodulator 42 and the ADCs 40a, 40b. Thus, the number of components can be reduced, resulting in cost reduction.

[3. Second Embodiment]

Hitherto, a limited radio resource is shared by a plurality of radio stations, with an operating frequency (hereinafter referred to as "channel") being assigned to each radio station.

If a certain radio station radiates power to a channel assigned to another radio station, which cannel is adjacent to a channel assigned to the certain radio station, crosstalk occurs between the radio stations.

Therefore, hitherto, regarding radio waves radiated from radio stations, standards for an adjacent channel leakage ratio (ACLR) (e.g., the standard defined by Association of Radio Industries and Businesses (ARIB)) have been provided. Therefore, when the amplifier circuit 1 is mounted to a wireless communication apparatus and used, it is essential to calculate an ACLR of the output signal y(t) of the amplifier 2, and evaluate whether or not the ACLR satisfies the standard.

In calculating an ACLR, generally, a power value in a predetermined operating band and power values of adjacent frequency components which are adjacent to the operating band at both ends thereof in a frequency axis direction, are obtained based on the output signal y(t) from the amplifier 2.

Figure 5:
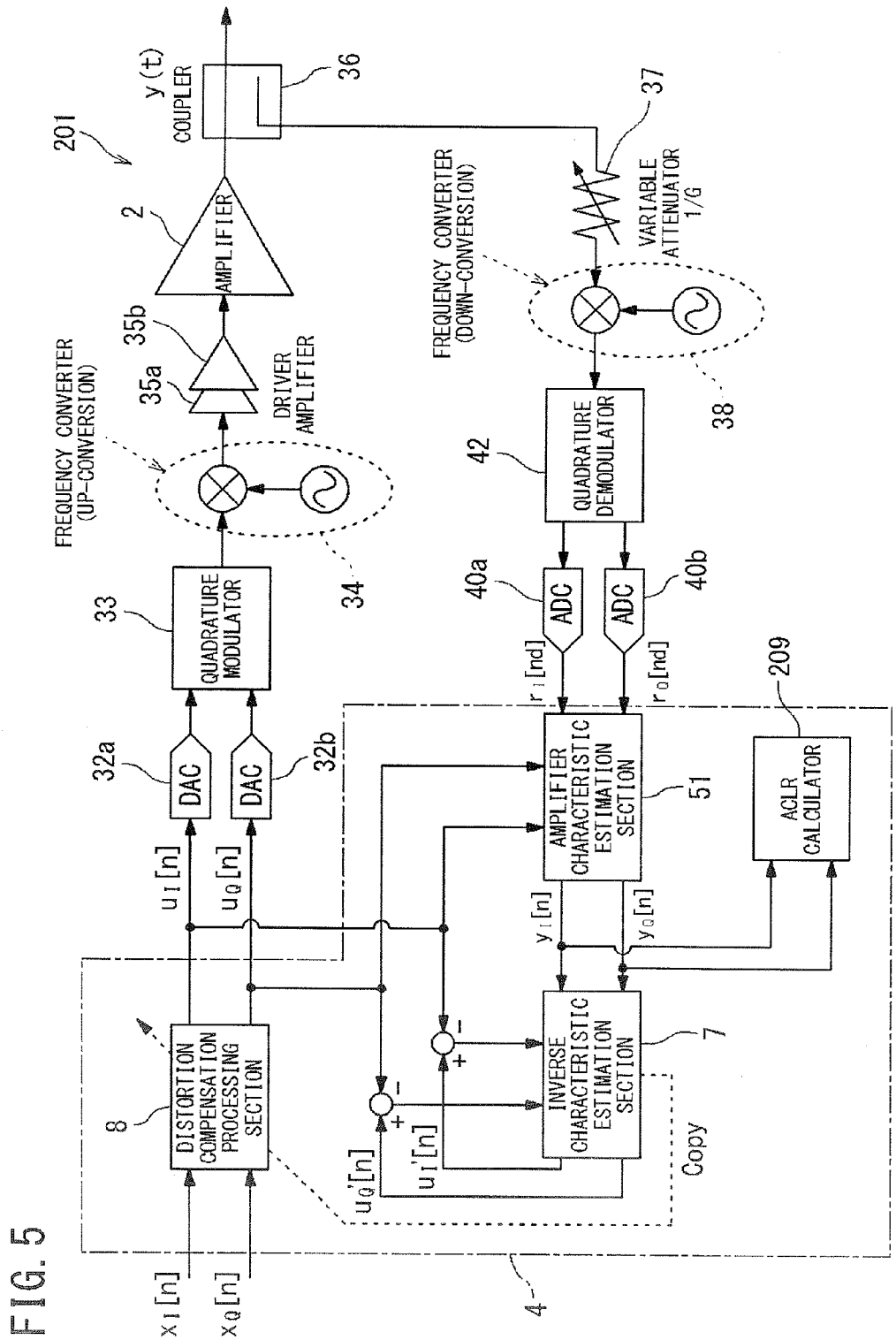
FIG. 5 is a circuit diagram of an amplifier circuit according to a second embodiment.

FIG. 5 shows an amplifier circuit 201 according to the present embodiment.

The amplifier circuit 201 is substantially identical to the amplifier circuit 1 of the first embodiment, and is different from the amplifier circuit 1 of the first embodiment in that a distortion compensation apparatus 204 includes an ACLR calculator 209. The same components as those of the amplifier circuit 1 of the first embodiment are given the same reference numerals, and descriptions thereof are omitted as appropriate.

The ACLR calculator 209 calculates an ACLR by using the restored signal (second digital monitor signal) $y_I[n]$, $y_Q[n]$ output from the amplifier characteristic estimation section 51. Specifically, first, the ACLR calculator 209 extracts a signal component in the operating band and signal components (adjacent frequency components) other than the signal component in the operating band, from the restored signal $y_I[n]$, $y_Q[n]$. The operating band has been set in advance, for example. Then, the ACLR calculator 209 calculates, based on the extracted signal components, an ACLR (a ratio between an average power value of the frequency component in the operating band, and an average power value of the adjacent frequency components).

When the ACLR is calculated, if necessary frequency components are not included in the monitor signal, the ACLR may not be accurately calculated. When the input signal $x_I[n]$, $x_Q[n]$ has a frequency band of 20 MHz, a monitor speed (monitor band) of five times the frequency band, i.e., 100 MHz, is required.

In contrast, in the amplifier circuit 201 according to the present embodiment, an ACLR of the output signal y(t) from the amplifier 2 is calculated by using the restored signal $y_I[n]$, $y_Q[n]$ in which signal components (adjacent frequency components) in a band wider than the band of the digital monitor signal $r_I[nd]$, $r_Q[nd]$ are reflected. Therefore, it is possible to accurately calculate the ACLR as compared to the configuration of calculating an ACLR of the output signal from the amplifier 2 by using the digital monitor signal $r_I[nd]$, $r_Q[nd]$ as it is.

[4. Third Embodiment]

An amplifier circuit 301 according to the present embodiment has the function of calculating an ACLR, like the amplifier circuit 201 according to the second embodiment. The amplifier circuit 301 of the present embodiment estimates, by using the input signal $x_I[n]$, $x_Q[n]$ and the digital monitor signal $r_I[n]$, $r_Q[n]$, a sequence model (hereinafter referred to as "distortion model") corresponding to an amplification sequence composed of the distortion compensation processing section 8, the DAC 32 (32a, 32b), the quadrature modulator 33, the frequency converter 35a, and the amplifier 2. Then, the amplifier circuit 301 calculates an ACLR by using a signal generated based on the estimated distortion model. Hereinafter, the amplifier 301 of the present embodiment will be described in detail.

Figure 6:
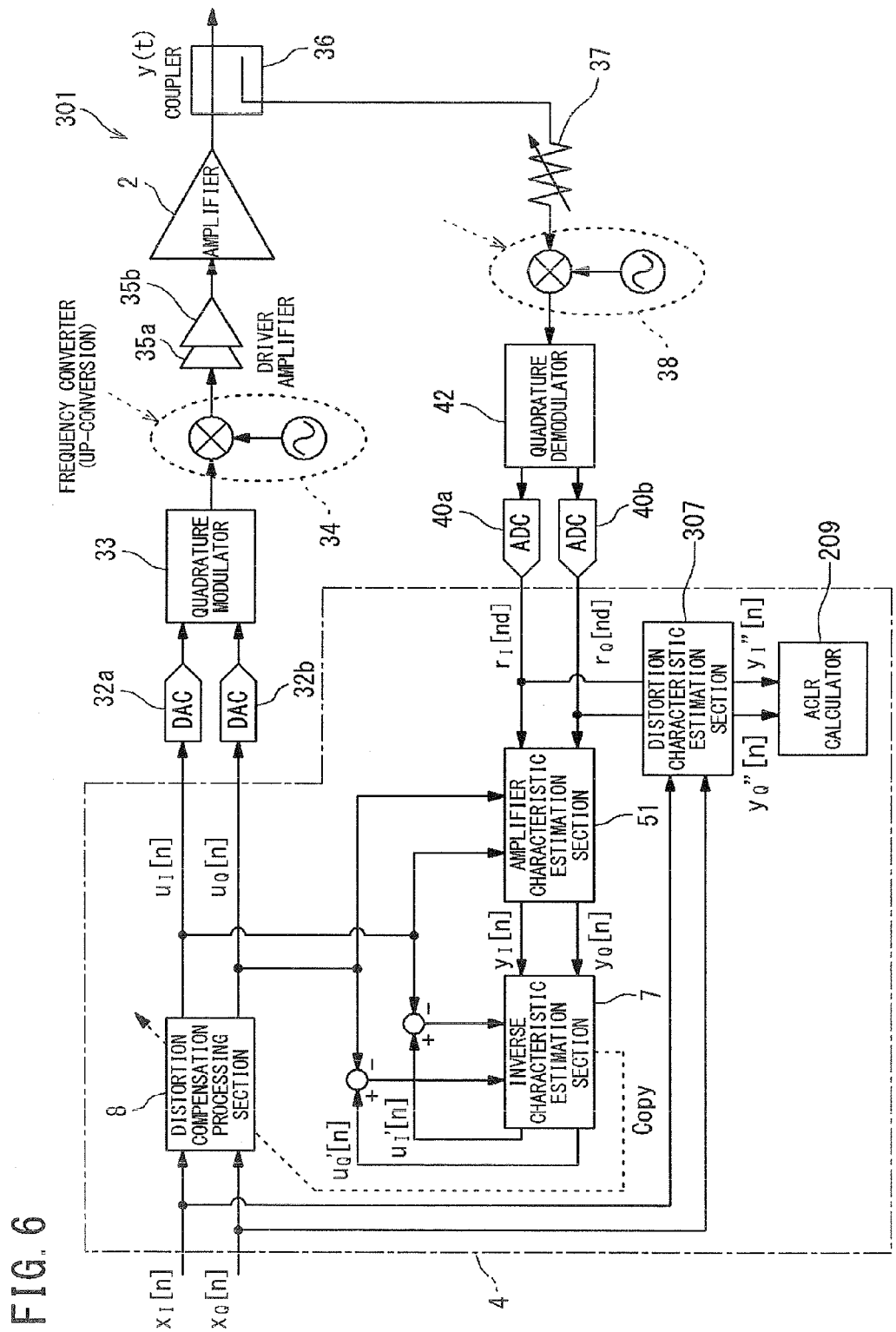
FIG. 6 is a circuit diagram of an amplifier circuit according to a third embodiment.

FIG. 6 shows the amplifier circuit 301 of the present embodiment.

The amplifier circuit 301 is substantially identical to the amplifier circuit 201 of the second embodiment, and is different from the amplifier circuit 201 of the second embodiment in that the distortion compensation apparatus 304 includes a distortion characteristic estimation section 307. The same components as those of the amplifier circuit 201 of the second embodiment are given the same reference numerals, and descriptions thereof are omitted as appropriate.

The distortion characteristic estimation section 307 estimates a distortion model. The distortion characteristic estimation section 307 estimates a distortion model, based on the input signal $x_I[n]$, $x_Q[n]$ input to the distortion compensation processing section 8 and the digital monitor signal (first digital monitor signal) $r_I[nd]$, $r_Q[nd]$. Then, the distortion characteristic estimation section 307 performs a distortion adding process on the input signal $x_I[n]$, $x_Q[n]$ by using the estimated distortion model, and outputs a distortion-added signal $y_I''[n]$, $y_Q''[n]$.

Next, the configuration and operation of the distortion characteristic estimation section 307 will be described in detail.

Figure 7A:
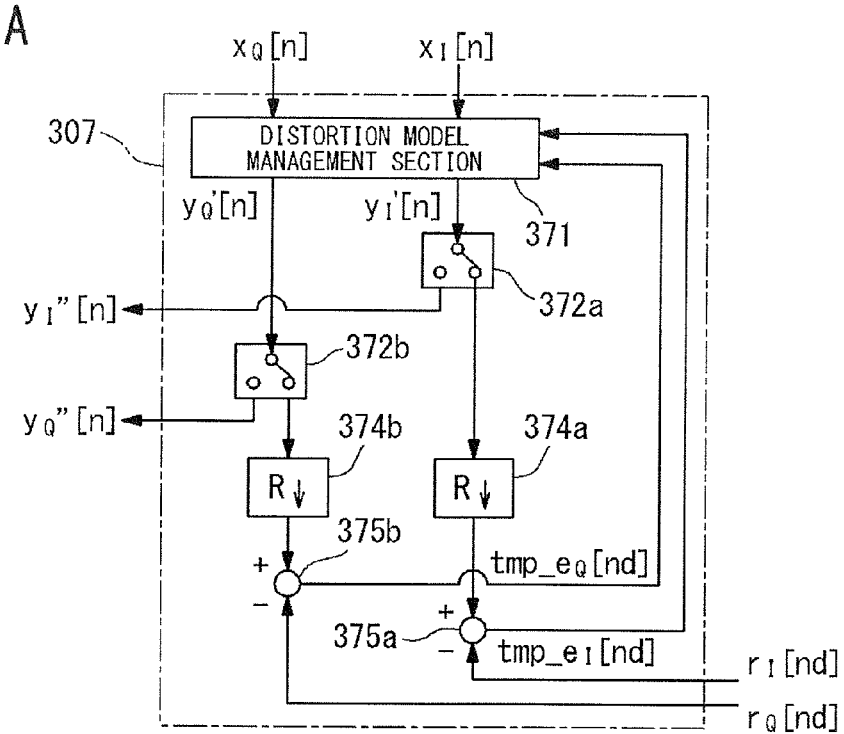
FIG. 7A shows a distortion characteristic estimation section according to the third embodiment shows a configuration thereof before a distortion model is established.
Figure 7B:
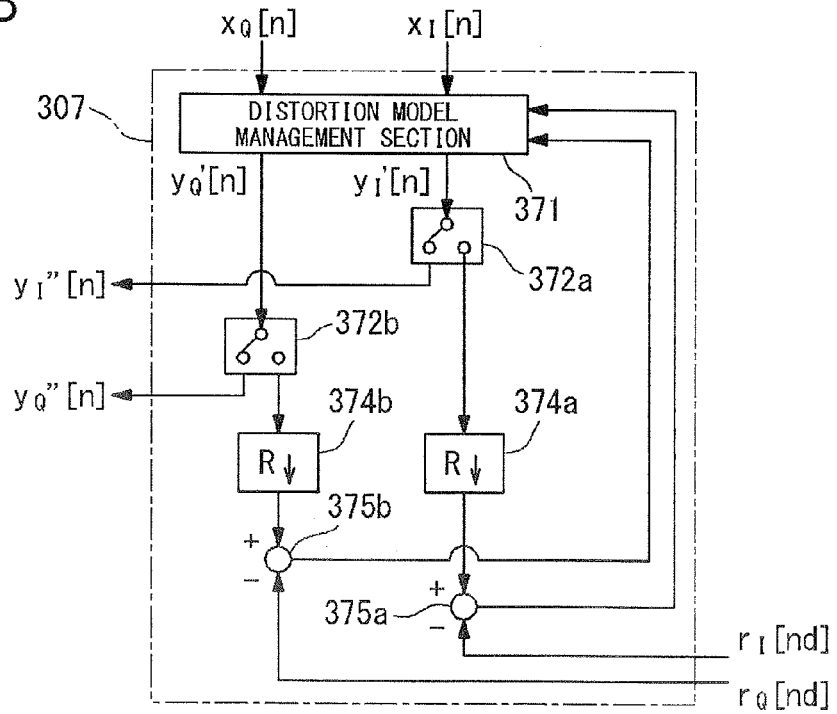
FIG. 7B shows a distortion characteristic estimation section according to the third embodiment and shows a configuration thereof after the distortion model is established.

FIG. 7 shows the configuration of the distortion characteristic estimation section 307 and shows the state before a distortion model is established. FIG. 7B shows the state after the distortion model is established.

The distortion characteristic estimation section 307 includes a distortion model management section 371, two selectors 372a, 372b, two decimation filters 374a, 374b, and differential units 375a, 375b. The same components as those of the amplifier circuit 201 of the second embodiment are given the same reference numerals, and descriptions thereof are omitted as appropriate.

The distortion model management section 371 manages the distortion model. The term "manage" means retention of the distortion model, updating of the distortion model, and the like. The distortion model management section 371 generates a replica signal (third replica signal) $y_I'[nd]$, $y_Q'[nd]$, based on the distortion model and the input signal $x_I[n]$, $x_Q[n]$, and outputs the replica signal. The distortion model is expressed by a relational expression established between the input signal $x_I[n]$, $x_Q[n]$ and the replica signal $y_I'[n]$, $y_Q'[n]$. The relational expression is expressed by the following equation (2) if a memory effect that occurs inside the amplification sequence is considered.

[Formula 2] (2)

$$y'[n] = \sum_{m=-L1}^{L1} \sum_{l=-M1}^{M1} \sum_{k=1}^{K} h_{k,l,m} \cdot |x[n-l-m]|^{k-1} \cdot x[n-l]$$

where $y'[n](=y_I'[n]+iy_Q'[n])$ indicates the replica signal, and $x[n](=x_I'[n]+ix_Q'[n])$ indicates the input signal.

l, m are parameters indicating a time difference with respect to a time corresponding to the replica signal $y'[n]$.

$h_{k,l,m}$ (k =0, 1, 2, . . . , K'$_{l,m}$) indicates a coefficient parameter representing the distortion model. The coefficient parameter depends on the values of l and m. A coefficient parameter $h_{k,l,m}$ (k =0, 1, 2, . . . , K'$_{l,m}$) in which at least one of l and m is not 0 reflects the degree of contribution of the above-mentioned memory effect.

Next, the operation of the distortion characteristic estimation section 307 will be described. It is assumed that the distortion model is expressed by the relational expression of the above equation (2).

The operation of the distortion characteristic estimation section 307 is similar to the operation of the amplifier characteristic estimation section 51 described above. Specifically, an operation flowchart of the distortion characteristic estimation section 307 is substantially identical to the operation flowchart shown in FIGS. 3, 4A, and 4B. The operation flowchart of the distortion characteristic estimation section 307 is different from the operation flowchart shown in FIGS. 3, 4A, and 4B in that the replica signal $y_I'[n]$, $y_Q'[n]$ is calculated by using the relational expression of the equation (2) in the process of step S2, and that a sampling rate of the input signal $x_I[n]$, $x_Q[n]$ is acquired in the process of step S21. Hereinafter, the operation of the distortion characteristic estimation section 307 will be briefly described.

First, the distortion model management section 371 calculates the replica signal $y_I'[n]$, $y_Q'[n]$ from the input signal $x_I[n]$, $x_Q[n]$ by using the equation (2) in which the coefficient parameter $h_{k,l,m}$ (k =0, 1, 2, . . . , K$_{l,m}$) is set to an initial value, and outputs the calculated replica signal $y_I'[n]$, $y_Q'[n]$.

The decimation filter 374a, 374b acquires a sampling rate Rate_x of the input signal $x_I[n]$, $x_Q[n]$ and a sampling rate Rate_r of the digital monitor signal $r_I[n]$, $r_Q[n]$. The decimation filter 374a, 374b calculates a ratio R(=Rate_x/Rate_r) of the sampling rate Rate_x to the sampling rate Rate_r.

The selector 372a, 372b sets the transmission path of the replica signal $y_I'[n]$, $y_Q'[n]$ to a path extending from the distortion model management section 371 to the decimation filter 374a, 374b.

Next, by using the calculated ratio R, the decimation filter 374a, 374b performs decimation on the replica signal $y_I'[n]$, $y_Q'[n]$ to generate a replica signal (fourth replica signal) $y_I'[R \times nd]$, $y_Q'[R \times nd]$.

Subsequently, the differential unit 375a, 375b generates an error signal (tmp_e$_I$[nd], tmp_e$_Q$[nd]) indicating an error between the replica signal $y_I'[R \times nd]$, $y_Q'[R \times nd]$ and the digital monitor signal $r_I[nd]$, $r_Q[nd]$, and outputs the error signal.

Thereafter, the amplifier model management section 511 calculates, by using the least squares method, a coefficient parameter $h_{k,l,m}$ (k =0, 1,2, . . . K'$_{l,m}$) with which the sum of squares of the error signal (temp_e$_I$[nd], temp_e$_Q$[nd]) is minimized.

Then, the selector 372a, 372b switches the transmission path of the replica signal $y_I'[n]$, $y_Q'[n]$ to a path extending from the distortion model management section 371 to the outside of the distortion characteristic estimation section 307. At this time, the replica signal $y_I'[n]$, $y_Q'[n]$ output from the distortion model management section 371 to the outside of the distortion characteristic estimation section 307 corresponds to the distortion-added signal $y_I''[n]$, $y_Q''[n]$. The process in which the distortion model management section 371, after the distortion model has been established, calculates the distortion-added signal $y_I''[n]$, $y_Q''[n]$ from the input signal $x_I[n]$, $x_Q[n]$ by using the equation (2), corresponds to the distortion adding process.

As described above, the distortion characteristic estimation section 307 generates the replica signal $y_I'[n]$, $y_Q'[n]$ of the output signal y(t) output from the amplification sequence based on the input signal $x_I[n]$, $x_Q[n]$. Next, the distortion characteristic estimation section 307 generates the replica signal $y_I'[R \times nd]$, $y_Q'[R \times nd]$ by subjecting the replica signal $y_I'[n]$, $y_Q'[n]$ to decimation corresponding to the digital monitor signal $r_I[n]$, $r_Q[n]$. Thereafter, the distortion characteristic estimation section 307 estimates the distortion model, based on the error signal tmp_e$_I$[nd], tmp_e$_Q$[nd] indicating an error of the digital monitor signal $r_I[n]$, $r_Q[n]$ with respect to the replica signal $y_I'[R \times nd]$, $y_Q'[R \times nd]$.

Consequently, in the amplifier circuit 301 of the present embodiment, the ACLR of the output signal y(t) from the amplifier 2 is calculated by using the distortion-added signal $y_I''[n]$, $y_Q''[n]$ in which signal components in a frequency band wider than that of the digital monitor signal $r_I[n]$, $r_Q[n]$ are reflected. Therefore, it is possible to accurately calculate the ACLR as compared to the configuration of calculating the ACLR of the output signal from the amplifier 2 by using the digital monitor signal $r_I[n]$, $r_Q[n]$.

[5. Modifications]

(1) In the first embodiment, an example is described in which the frequency band of the restored signal (second digital monitor signal) $y_I[n]$, $y_Q[n]$ is set to be the same as the frequency band of the compensated signal $u_I[n]$, $u_Q[n]$. However, the band of the restored signal $y_I[n]$, $y_Q[n]$ is not limited thereto. For example, the band of the restored signal $y_I[n]$, $y_Q[n]$ may be set to be greater than the band (monitor band) of the digital monitor signal (first digital monitor signal) $r_I[nd]$, $r_Q[nd]$ and smaller than the band of the compensated signal $u_I[n]$, $u_Q[n]$.

According to this configuration, the amount of data constituting the restored signal $y_I[n]$, $y_Q[n]$ can be reduced, whereby the amount of calculation performed in the amplifier characteristic estimation section 51 can be reduced.

(2) In the first embodiment, an example is described in which the sampling frequency of the ADC 40a, 40b is set to be the same as the frequency band of the input signal $x_I[n]$, $x_Q[n]$. However, the sampling frequency of the ADC 40a, 40b is not limited thereto. For example, the sampling frequency of the ADC 40a, 40b may be set to be lower than the frequency band of the input signal x$_I$[n], x$_Q$[n].

According to this configuration, an ADC having a low sampling frequency specification can be used as the ADC 40a, 40b, whereby the cost of the ADC 40a, 40b can be reduced.

(3) In the first embodiment, an example is described in which the quadrature demodulator 42 performs quadrature demodulation on the signal output from the frequency converter 38. However, the signal to be subjected to the quadrature demodulation is not limited thereto. For example, the quadrature demodulator may perform quadrature demodulation on a digital signal into which the signal output from the frequency converter 38 is converted.

According to this configuration, the quadrature demodulation can be performed by digital signal processing.

(4) In the first embodiment, an example is described in which the estimation section 7 estimates a model of a virtual amplifier which represents an amplification characteristic inverse to the amplification characteristic of the amplifier 2. However, the amplifier model to be estimated is not limited to the inverse model. For example, the estimation section 7 may estimate a forward model representing the amplification characteristic of the amplifier 2. In this case, the distortion compensation processing section 8 is configured to generate an inverse model from the forward model and then perform predistortion by using the inverse model.

According to this configuration, the estimation section 7 and the amplifier characteristic estimation section 51 can be integrated with each other. Therefore, the configuration of the distortion compensation apparatus 4 can be simplified.

(5) In the first embodiment and the second embodiment, an example is described in which the forward model corresponds to a model of an amplifier which is not a so-called envelope tracking (ET) type, that is, which is a non-ET amplifier. However, the forward model is not limited to the model corresponding to the non-ET amplifier, but may be a model corresponding to an ET type amplifier.

In this case, the forward model managed by the amplifier model management section 511 is expressed by the following equation (3):

[Formula 3]

$$y'[n] = \sum_{l=-L_1}^{L_2} \sum_{m=-M_1}^{M_2} \sum_{k=1}^{K'_{m,l}} g_{k,l,m} \cdot |x[n-l-m]|^{k-1} \cdot u[n-l] \quad (3)$$

where y'[n] (=y$_I$'[n]+iy$_Q$'[n]) indicates the replica signal, x[n] indicates the input signal, and u[n] (=u$_I$'[n]+iu$_Q$'[n]) indicates the compensated signal.

Since the meanings of l, m, and g$_{k,l,m}$ (k=0, 1, 2, ..., K'$_{l,m}$) are identical to those of the equation (1), descriptions thereof are omitted.

According to this configuration, the amplifier characteristic estimation section 51 estimates the forward model, based on the input signal x$_I$[n], x$_Q$[n] as well as the compensated signal u$_I$[n], u$_Q$[n] and the digital monitor signal r$_I$[n], r$_Q$[n].

[6. Appended Notes]

The embodiments described above are to be considered in all respects as illustrative and not restrictive. The scope of the present invention is indicated by the appended claims rather than by the foregoing meaning, and all changes which come within the meaning and range of equivalency of the claims are therefore intended to be embraced therein.

Further, low-pass filters may be inserted as appropriate between the quadrature demodulator 42 and the ADCs 40a, 40b, in order to remove noise components other than the distortion signal to be monitored. The "noise components other than the distortion signal to be monitored" correspond to, for example, noise components generated inside and outside the distortion compensation apparatus.

For example, when a signal having a frequency band of 100 MHz and including a distortion component is desired to be monitored, the sampling frequency of the ADCs 40a, 40b is set to 20 MHz, and the passband of the low-pass filter is set to 50 MHz.

REFERENCE SIGNS LIST 1, 201, 301 amplifier circuit
2 amplifier
4, 204, 304 distortion compensation apparatus
7 estimation section
8 distortion compensation processing section
32a, 32b DAC (DA converter)
40a, 40b ADC (AD converter)
51 amplifier characteristic estimation section (signal generation section)
209 ACLR calculator
307 distortion characteristic estimation section (sequence characteristic estimation section)

The invention claimed is:

1. A distortion compensation apparatus that compensates for distortion of an amplifier, comprising:
a distortion compensation processing section configured to perform a distortion compensation process on an input signal to the amplifier, based on a first amplifier model of the amplifier, and output a compensated signal;
a signal generation section configured to receive the compensated signal and a first digital monitor signal, and generate a second digital monitor signal; and
an estimation section configured to estimate the first amplifier model, based on the compensated signal and the second digital monitor signal, wherein
the first digital monitor signal is a signal generated by subjecting an analog monitor signal obtained by monitoring an output signal from the amplifier, to analog-to-digital conversion,
a monitor band of the first digital monitor signal is narrower than a frequency band of the compensated signal,
a frequency band of the second digital monitor signal is wider than the monitor band of the first digital monitor signal, and includes signal components obtained by restoring signal components outside the monitor band, among signal components included in the analog monitor signal, and
the signal generation section restores the signal components outside the monitor band among the signal components included in the analog monitor signal, based on the compensated signal and the first digital monitor signal.

2. The distortion compensation apparatus according to claim 1, wherein the estimation section generates a replica signal of the compensated signal based on the second digital monitor signal, and estimates the first amplifier model based on an error signal indicating an error of the replica signal with respect to the compensated signal.

3. The distortion compensation apparatus according to claim 1, wherein the signal generation section estimates a second amplifier model of the amplifier based on the compensated signal and the first digital monitor signal, and performs a distortion adding process on the compensated signal by using the estimated second amplifier model to generate the second digital monitor signal.

4. The distortion compensation apparatus according to claim 3, wherein
the signal generation section
generates a first replica signal of the compensated signal based on the compensated signal and the first digital monitor signal,
generates a second replica signal by performing decimation to make a frequency band of the first replica signal correspond to the monitor band, and
estimates the second amplifier model based on an error signal indicating an error of the first digital monitor signal with respect to the second replica signal.

5. The distortion compensation apparatus according to claim 1, further comprising an ACLR calculator configured to calculate an ACLR, based on the second digital monitor signal generated by the signal generation section.

6. The distortion compensation apparatus according to claim 1, further comprising:
a sequence characteristic estimation section configured to estimate a sequence model of an amplification sequence including the amplifier and the distortion compensation processing section, based on an input signal to the distortion compensation processing section and on the first digital monitor signal, perform a distortion adding process on the input signal, based on the estimated sequence model, and output a distortion-added signal; and
an ACLR calculator configured to calculate an ACLR by using the distortion-added signal output from the sequence characteristic estimation section.

7. The distortion compensation apparatus according to claim 6, wherein
the sequence characteristic estimation section
generates a third replica signal of an output signal from the amplification sequence, based on the input signal,
generates a fourth replica signal by performing decimation to make a frequency band of the third replica signal correspond to the monitor band, and
estimates the sequence model, based on an error signal indicating an error of the first digital monitor signal with respect to the fourth replica signal.

8. The distortion compensation apparatus according to claim 1, wherein the amplifier has a power efficiency of 30% or more.

9. The distortion compensation apparatus according to claim 1, wherein the input signal has a frequency band of 20 MHz or more.

10. A wireless communication apparatus including the distortion compensation apparatus according to claim 1.

* * * * *